(12) United States Patent
Du et al.

(10) Patent No.: US 11,196,022 B2
(45) Date of Patent: Dec. 7, 2021

(54) PACKAGE STRUCTURE AND DISPLAY DEVICE INCLUDING PACKAGE STRUCTURE

(71) Applicant: Yungu (Gu'an) Technology Co., Ltd., Langfang (CN)

(72) Inventors: Jiamei Du, Langfang (CN); Jinqiang Liu, Langfang (CN); Yaoyan Wu, Langfang (CN); Zhenhua Xing, Langfang (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 14 days.

(21) Appl. No.: 16/600,608

(22) Filed: Oct. 14, 2019

(65) Prior Publication Data

US 2020/0044194 A1 Feb. 6, 2020

Related U.S. Application Data

(63) Continuation of application No. PCT/CN2018/092304, filed on Jun. 22, 2018.

(30) Foreign Application Priority Data

Dec. 29, 2017 (CN) .......................... 201721917717.8

(51) Int. Cl.
*H01L 51/52* (2006.01)
*H01L 27/32* (2006.01)

(52) U.S. Cl.
CPC ...... *H01L 51/5253* (2013.01); *H01L 27/3244* (2013.01); *H01L 2251/303* (2013.01); *H01L 2251/5338* (2013.01)

(58) Field of Classification Search
CPC combination set(s) only.
See application file for complete search history.

(56) References Cited

U.S. PATENT DOCUMENTS

| | | | |
|---|---|---|---|
| 2012/0282419 A1 | 11/2012 | Ahn | |
| 2012/0308884 A1* | 12/2012 | Oguni | B82Y 30/00 429/209 |
| 2015/0016022 A1* | 1/2015 | Lee | B32B 37/02 361/502 |

(Continued)

FOREIGN PATENT DOCUMENTS

| | | |
|---|---|---|
| CN | 102166844 A | 8/2011 |
| CN | 103682054 A | 3/2014 |
| CN | 103692743 A | 4/2014 |

(Continued)

OTHER PUBLICATIONS

PCT International Search Report dated Sep. 27, 2018 in International Application No. PCT/CN2018/092304.

(Continued)

*Primary Examiner* — Moin M Rahman
(74) *Attorney, Agent, or Firm* — Rimon PC

(57) ABSTRACT

Embodiments of the present application provide a package structure and a display device including package structure. The package structure includes a graphene layer and a graphene oxide layer which are disposed in a stack. In the package structure according to the embodiments of the present application, the graphene oxide layer is stacked on the graphene layer.

7 Claims, 2 Drawing Sheets

(56) References Cited

U.S. PATENT DOCUMENTS

2016/0247933 A1* 8/2016 Hu .................. H01L 27/1222
2017/0174537 A1* 6/2017 Zheng ................ B01D 71/024

FOREIGN PATENT DOCUMENTS

| CN | 105514143 A | 4/2016 |
| CN | 105848882 A | 8/2016 |
| CN | 105870149 A | 8/2016 |

OTHER PUBLICATIONS

PCT Written Opinion dated Sep. 27, 2018 in International Application No. PCT/CN2018/092304.
Chinese First Office Action for CN Application No. 201721917717.8 dated Jun. 26, 2018.

* cited by examiner

PACKAGE STRUCTURE AND DISPLAY DEVICE INCLUDING PACKAGE STRUCTURE

CROSS-REFERENCE TO RELATED APPLICATIONS

This application is a continuation of International Application No. PCT/CN2018/092304 filed on Jun. 22, 2018, which claims priority to Chinese patent application No. 201721917717.8 filed on Dec. 29, 2017. Both applications are incorporated herein by reference in their entireties.

TECHNICAL FIELD

The present application relates to the field of display technologies, particularly to a package structure and a display device including package structure.

BACKGROUND

With the continuous development of electronic display technologies, requirements for a display screen of electronic equipment are getting higher and higher. As one of important development directions of the display screen of the electronic equipment, a flexible screen has gradually received more and more attention. The flexible screen has characteristics such as bendability, strong flexibility, etc., and has a plurality of advantages such as being light and thin, low power consumption, convenient carrying, strong plasticity, brilliant color and so on.

A Thin Film Encapsulation (TFE) package structure of the existing flexible screen mainly includes a stacked structure of an inorganic layer, an organic layer and another inorganic layer. The inorganic layers are mainly made of a SiN material to block external water and oxygen. The organic layer is mainly made of an acrylic material to reduce defects and stresses in the inorganic layers. Due to large stresses existing in the inorganic layers of the existing package structure, stratification or fault phenomenon is likely to occur between the inorganic layers and the organic layer in the package structure during an actual bending process.

SUMMARY

In view of this, embodiments of the present application provide a package structure and a display device including package structure to solve the problem that stratification or fault phenomenon is likely to occur in the package structure during a bending process.

In a first aspect, a package structure according to an embodiment of the present application includes a graphene layer and a graphene oxide layer which are disposed in a stack.

In an embodiment of the present application, the package structure further includes a second graphene layer which is adjacent to and stacked with the graphene oxide layer, and disposed on a side of the graphene oxide layer opposite a side of the graphene oxide layer on which the graphene layer is located.

In an embodiment of the present application, adjacent surfaces between the graphene oxide layer and the graphene layer or adjacent surfaces between the graphene oxide layer and the second graphene layer include mutually adapted concave-convex sawtooth structures.

In an embodiment of the present application, the package structure further includes a second graphene oxide layer which is adjacent to and stacked with the graphene layer, and disposed on a side of the graphene layer opposite a side of the graphene layer on which the graphene oxide layer is located.

In an embodiment of the present application, adjacent surfaces between the graphene layer and the graphene oxide layer or adjacent surfaces between the graphene layer and the second graphene oxide layer include mutually adapted concave-convex sawtooth structures.

In an embodiment of the present application, the package structure further includes a stacked periodic structure adjacent to the graphene layer or the graphene oxide layer. A stacked period of the stacked periodic structure refers to a graphene layer and a graphene oxide layer which are disposed in a stack.

In an embodiment of the present application, a thickness of the graphene oxide layer is 10 nm to 1000 nm.

In an embodiment of the present application, a thickness of the graphene layer is 10 nm to 1000 nm.

In an embodiment of the present application, the graphene layer is prepared by a CAD method or an ALD method; and/or the graphene oxide layer is prepared by an IJP method.

In a second aspect, a display device according to an embodiment of the present application includes a display layer, a display driving layer and a substrate layer which are disposed in a stack and the package structure described in any of the above embodiments which is adjacent to and stacked with the display layer.

In the package structure according to the embodiments of the present application, the graphene oxide layer is stacked on the graphene layer. Therefore, amphiphilicity and high toughness of graphene oxide are fully utilized, and mechanical property of bending resistance of the package structure is improved. Moreover, occurrence of the stratification or the fault phenomenon in the package structure is effectively avoided by the amphiphilicity of the graphene oxide.

DETAILED DESCRIPTION

In order to make the purposes, technical means and advantages of the present application clearer, the present application will be further described in detail below with reference to the accompanying drawings.

Figure 1:
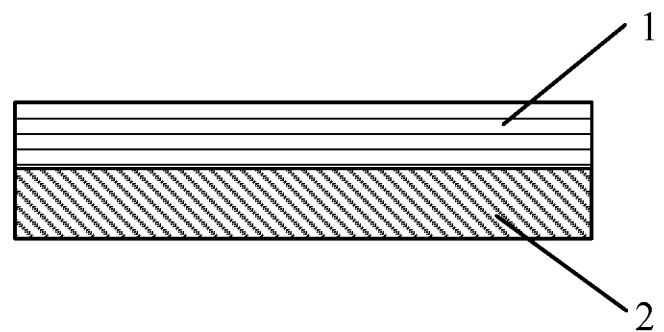
FIG. 1 is a schematic structural diagram of a package structure according to an embodiment of the present application.

FIG. 1 is a schematic structural diagram of a package structure according to an embodiment of the present application. As shown in FIG. 1, the package structure according to the embodiment of the present application includes a graphene layer 1 (i.e., a first graphene layer) and a graphene oxide layer 2 (i.e., a first graphene oxide layer) which are disposed in a stack.

Since a graphene material itself has characteristics such as high flexibility, high transmittance, excellent water and oxygen barrier ability, etc., setting the graphene layer 1 in the package structure may sufficiently improve a packaging effect and a mechanical property of bending resistance of the package structure.

Graphene and graphene oxide have good lattice matching ability due to consistent lattice structures in the graphene and the graphene oxide. In addition, since the graphene layer exhibits a hydrophilic to hydrophobic nature distribution from the edge to the center, the graphene oxide layer may be closely adhered to the graphene layer by amphiphilicity of the graphene oxide layer itself. Therefore, the package structure formed by stacking the graphene oxide layer 2 on the graphene layer 1 may easily cope with high strength bending and folding operations without occurrence of stratification or fault phenomenon.

In an actual preparation process, the graphene layer 1 is prepared by a Chemical Vapor Deposition (CVD) method, an Atomic Layer Deposition (ALD) method or an Inkjet Printing (IJP) method or other methods, and the graphene oxide layer 2 is prepared by an IJP method or other methods.

It may be noted that in a practical application process, the graphene layer 1 may be disposed adjacent to a display layer of a display device, or the graphene oxide layer 2 may be disposed adjacent to the display layer of the display device. Which layer is disposed adjacent to the display layer of the display device is not limited in the embodiments of the present application.

In the package structure according to the embodiments of the present application, the graphene oxide layer is stacked on the graphene layer. Therefore, the amphiphilicity and high toughness of the graphene oxide are fully utilized, and the mechanical property of bending resistance of the package structure is improved. Moreover, the occurrence of the stratification or the fault phenomenon in the package structure is effectively avoided by the amphiphilicity of the graphene oxide.

Figure 2:
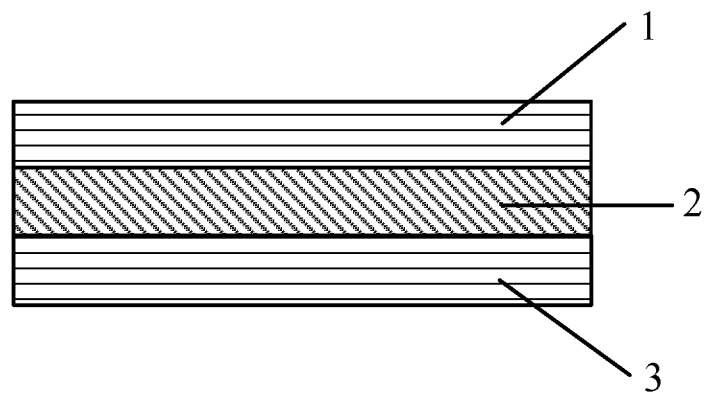
FIG. 2 is a schematic structural diagram of a package structure according to another embodiment of the present application.

FIG. 2 is a schematic structural diagram of a package structure according to another embodiment of the present application. The embodiment of the present application is extended on the basis of the embodiment shown in FIG. 1 of the present application. Differences will be emphatically described below, and similarities are not described again.

As shown in FIG. 2, the package structure according to the embodiment of the present application further includes a second graphene layer 3. The second graphene layer 3 is disposed adjacent to and stacked with the graphene oxide layer 2, and disposed on a side of the graphene oxide layer 2 opposite a side of the graphene oxide layer 2 on which the graphene layer 1 is located.

In a practical application process, the second graphene layer 3 may be disposed adjacent to the display layer of the display device.

In an actual preparation process, the graphene layer 1 and the second graphene layer 3 may be prepared by a CVD method, an ALD method, an IJP method or other methods. The graphene oxide layer 2 may be prepared by an IJP method or other liquid phase methods.

Film quality of the graphene oxide layer prepared by an IJP method or the other liquid phase methods is better and the cost is low.

Since a film structure of a graphene layer, a graphene oxide layer and another graphene layer is arranged in the package structure, a packaging effect of the package structure may be realized by the excellent water and oxygen barrier ability of the top graphene layer and the bottom graphene layer, and the flexibility of the package structure may be increased by the middle graphene oxide layer. In addition, due to the consistent lattice structures in the graphene oxide layer and the graphene layer and the amphiphilicity of the graphene oxide, the stratification or the fault phenomenon in the package structure may be effectively avoided by setting the graphene oxide layer between the two graphene layers.

In the package structure according to the embodiments of the present application, the graphene layer, the graphene oxide layer and the second graphene layer are stacked in sequence. Therefore, the water and oxygen barrier ability of the package structure is further improved, and the stratification or the fault phenomenon in the package structure may be effectively avoided by the amphiphilicity of the graphene oxide.

The second graphene layer 3 includes, but is not limited to other film layers having characteristics such as high flexibility, high transmittance, excellent water and oxygen barrier ability or water and oxygen absorption ability. Therefore, the second graphene layer 3 acts as a reinforcing layer to enhance the packaging effect of the package structure.

Figure 3:
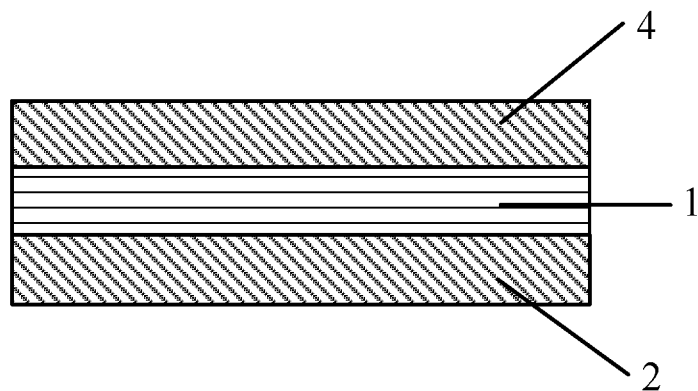
FIG. 3 is a schematic structural diagram of a package structure according to still another embodiment of the present application.

FIG. 3 is a schematic structural diagram of a package structure according to still another embodiment of the present application. The embodiment of the present application is extended on the basis of the embodiment shown in FIG. 1 of the present application. Differences will be emphatically described below, and similarities are not described again.

As shown in FIG. 3, the package structure according to the embodiment of the present application further includes a second graphene oxide layer 4. The second graphene oxide layer 4 is disposed adjacent to and stacked with the graphene layer 1, and disposed on a side of the graphene layer 1 opposite a side of the graphene layer 1 on which the graphene oxide layer 2 is located.

In a practical application process, the graphene oxide layer 2 may be disposed adjacent to the display layer of the display device.

In an actual preparation process, the graphene oxide layer 2 and the second graphene oxide layer 4 may be prepared by an IJP method or other methods. The graphene layer 1 may be prepared by a CVD method, an ALD method, an IJP method or other methods.

In an embodiment of the present application, the package structure includes a stacked periodic structure. A stacked period of the stacked periodic structure refers to a graphene layer and a graphene oxide layer which are disposed in a stack. In the package structure according to the embodiment of the present application, packaging ability and the mechanical property of bending resistance of the package structure are further improved by setting the package structure to include the stacked periodic structure.

In an embodiment of the present application, adjacent surfaces between a graphene oxide layer and a graphene layer or adjacent surfaces between a graphene oxide layer and another graphene oxide layer include mutually adapted concave-convex sawtooth structures. Bonding ability among film layers of the package structure may be improved by setting the adjacent surfaces to include the mutually adapted concave-convex sawtooth structures. Therefore, stratification or fault phenomenon may be further effectively prevented.

Other mutually adapted concave-convex structures (such as other mortise-tenon structures) may also be applied to the adjacent surfaces between the graphene layer and the graphene oxide layer or between the graphene oxide layer and another graphene oxide layer of the package structure in the embodiment of the present application. By this way, the stratification or the fault phenomenon may be further prevented in the package structure according to the embodiments of the present application.

In addition, other materials with mutually matched lattice interfaces may also be applied to the adjacent surfaces between the graphene layer and the graphene oxide layer or between the graphene oxide layer and another graphene oxide layer of the package structure in the embodiment of the present application. By this way, the stratification or the fault phenomenon may be further prevented in the package structure according to the embodiments of the present application.

Figure 4:
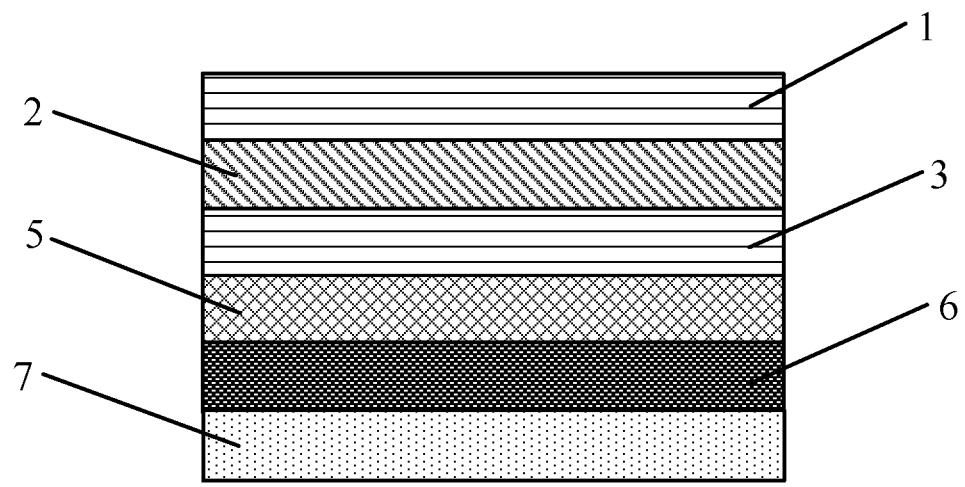
FIG. 4 is a schematic structural diagram of a display device according to an embodiment of the present application.

FIG. 4 is a schematic structural diagram of a display device according to an embodiment of the present application. The embodiment of the present application is extended on the basis of the embodiment shown in FIG. 2 of the present application. Differences will be emphatically described below, and similarities are not described again.

As shown in FIG. 4, according to the embodiment of the present application, the display device includes the package structure according to the embodiment shown in FIG. 2 of the present application, an Organic Light Emitting Diode (OLED) layer 5, a Thin Film Transistor (TFT) layer 6 and a Polyimide (PI) layer 7. The package structure, the OLED layer 5, the TFT layer 6 and the PI layer 7 are sequentially stacked from top to bottom (a top-bottom direction in the display device shown in FIG. 4).

The package structure of the display device according to the embodiment of the present application may be replaced with the package structure shown in other embodiments. Which package structure is applied to the display device is not limited in the embodiment of the present application.

In the display device according to the embodiments of the present application, mechanical property of bending resistance and water and oxygen barrier ability of the display device are improved by setting the package structure including the stacked graphene layer and graphene oxide layer adjacent to the display layer. Moreover, the occurrence of stratification or fault phenomenon in the package structure is effectively avoided by amphiphilicity of graphene oxide.

In an embodiment of the present application, an electronic equipment having a display device is also provided. The electronic equipment includes the display device according to one of the above embodiments. The electronic equipment may be, but is not limited to, a mobile phone, a tablet, a display and so on.

In an embodiment of the present application, a thickness of a graphene oxide layer is 10 nm to 1000 nm. Water and oxygen adsorption ability, flexibility and amphiphilicity of the graphene oxide layer may be fully exerted by setting the thickness of the graphene oxide layer to be 10 nm to 1000 nm. Thereby, the packaging effect and the mechanical property of bending resistance of the package structure are improved. Moreover, occurrence of stratification or fault phenomenon in the package structure can be effectively avoided by the amphiphilicity of graphene oxide.

In an embodiment of the present application, a thickness of a graphene layer is 10 nm to 1000 nm. Water and oxygen barrier ability and flexibility of the graphene layer may be fully exerted by setting the thickness of the graphene layer to be 10 nm to 1000 nm. Thereby, the packaging effect and the mechanical property of bending resistance of the package structure are improved.

The above embodiments are only the preferred embodiments of the present application, and are not intended to limit the scope of the present application. Any modifications, equivalent replacements, improvements, etc. made within the spirit and principles of the present application may be included within the scope of the present application.

What is claimed is:

1. A package structure for a display screen, comprising a graphene layer and a graphene oxide layer which are disposed in a stack; and a second graphene layer adjacent to and stacked with the graphene oxide layer, and disposed on a side of the graphene oxide layer opposite to a side of the graphene oxide layer on which the graphene layer is located; wherein the package structure is disposed on a display layer of the display screen, a thickness of the graphene oxide layer is 10 nm to 1000 nm, and a thickness of the graphene layer is 10 nm to 100 nm, wherein adjacent surfaces between the graphene oxide layer and the graphene layer or adjacent surfaces between the graphene oxide layer and the second graphene layer comprise mutually adapted concave-convex structures.

2. The package structure of claim 1, further comprising a second graphene oxide layer adjacent to and stacked with the graphene layer, and disposed on a side of the graphene layer opposite to a side of the graphene layer on which the graphene oxide layer is located.

3. The package structure of claim 2, wherein adjacent surfaces between the graphene layer and the graphene oxide layer or adjacent surfaces between the graphene layer and the second graphene oxide layer comprise mutually adapted concave-convex structures.

4. The package structure of claim 1, further comprising a stacked periodic structure adjacent to the graphene layer or the graphene oxide layer, wherein a stacked period of the stacked periodic structure refers to a graphene layer and a graphene oxide layer which are disposed in a stack.

5. The package structure of claim 1, wherein the graphene layer is manufactured by a Chemical Vapor Deposition method or an Atomic Layer Deposition method; and/or the graphene oxide layer is manufactured by an Inkjet Printing method.

6. A display device, comprising:

a display layer, a display driving layer and a substrate layer which are disposed in a stack; and the package structure of claim 1 which is adjacent to and stacked with the display layer.

7. A display screen assembly, comprises: a display screen having a display layer; and a package structure for the display screen, the package structure comprising a graphene layer and a graphene oxide layer which are disposed in a stack; and a second graphene layer adjacent to and stacked with the graphene oxide layer, and disposed on a side of the graphene oxide layer opposite to a side of the graphene oxide layer on which the graphene layer is located, a thickness of the graphene oxide layer is 10 nm to 1000 nm, a thickness of the graphene layer is 10 nm to 100 nm; wherein the package structure is disposed on the display layer of the display screen, wherein adjacent surfaces between the graphene oxide layer and the graphene layer or adjacent surfaces between the graphene oxide layer and the second graphene layer comprise mutually adapted concave-convex structures.

* * * * *